(12) United States Patent
Cho

(10) Patent No.: US 7,928,786 B2
(45) Date of Patent: Apr. 19, 2011

(54) CLOCK BUFFER CIRCUIT OF SEMICONDUCTOR DEVICE CONFIGURED TO GENERATE AN INTERNAL CLOCK SIGNAL

(75) Inventor: Kwang Jun Cho, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/657,208

(22) Filed: Jan. 14, 2010

(65) Prior Publication Data

US 2010/0117689 A1    May 13, 2010

Related U.S. Application Data

(62) Division of application No. 11/818,629, filed on Jun. 15, 2007, now abandoned.

(30) Foreign Application Priority Data

Dec. 29, 2006 (KR) .................... 10-2006-0138768

(51) Int. Cl.
    *H03K 3/017* (2006.01)
(52) U.S. Cl. ........ 327/176; 327/293; 327/294; 326/112; 326/114
(58) Field of Classification Search .................. 327/176, 327/293, 294; 326/112, 114
    See application file for complete search history.

(56) References Cited

U.S. PATENT DOCUMENTS

| 5,731,724 | A | 3/1998 | Grishakov et al. |
| 6,310,499 | B1 | 10/2001 | Radjassamy |
| 6,407,608 | B1 | 6/2002 | Brown et al. |
| 6,411,151 | B1 | 6/2002 | Nair et al. |
| 6,462,590 | B2 | 10/2002 | Warwar |
| 6,703,879 | B2 | 3/2004 | Okuda et al. |
| 6,777,986 | B2 * | 8/2004 | Hidaka et al. ................. 327/108 |
| 6,847,582 | B2 | 1/2005 | Pan |
| 7,518,425 | B2 | 4/2009 | Heightley |
| 7,649,380 | B2 * | 1/2010 | Kim et al. ........................ 326/26 |
| 7,719,315 | B2 * | 5/2010 | Ngo et al. ........................ 326/93 |

FOREIGN PATENT DOCUMENTS

| KR | 10-2002-0048258 | 6/2002 |
| KR | 10-2005-0083423 A | 8/2005 |

OTHER PUBLICATIONS

Office Action issued Mar. 5, 2009 in connection with U.S. Appl. No. 11/818,629, filed Jun. 15, 2007.
Office Action issued May 8, 2009 in connection with U.S. Appl. No. 11/818,629, filed Jun. 15, 2007.
Final Office Action issued Oct. 14, 2009 in connection with U.S. Appl. No. 11/818,629, filed Jun. 15, 2007.

* cited by examiner

*Primary Examiner* — Kenneth B. Wells
(74) *Attorney, Agent, or Firm* — John P. White; Cooper & Dunham LLP

(57) ABSTRACT

A clock buffer circuit of a semiconductor device is disclosed which receives an external clock signal and generates an internal clock signal with no duty distortion. The clock buffer circuit includes a first clock buffer for receiving and buffering a normal-phase clock signal, a second clock buffer for receiving and buffering a reverse-phase clock signal, and an internal clock generator for generating an internal clock signal in response to output signals from the first and second clock buffers.

7 Claims, 10 Drawing Sheets

(2 of 10 Drawing Sheet(s) Filed in Color)

US 7,928,786 B2

CLOCK BUFFER CIRCUIT OF SEMICONDUCTOR DEVICE CONFIGURED TO GENERATE AN INTERNAL CLOCK SIGNAL

CROSS-REFERENCES TO RELATED APPLICATIONS

This application is a divisional of U.S. Ser. No. 11/818,629, filed Jun. 15, 2007, now abandoned, which claims priority of Korean patent application number 10-2006-0138768, filed Dec. 29, 2006, the contents of which are hereby incorporated by reference into this application.

BACKGROUND OF THE INVENTION

The present invention relates to a semiconductor device, and more particularly to a clock buffer circuit for buffering a clock signal.

In general, a semiconductor memory device, such as a dynamic random access memory (DRAM), comprises a memory array including a plurality of memory cells for storing data.

Particularly, in a synchronous DRAM (SDRAM) among various DRAMs, a data read/write operation is carried out synchronously with an external clock signal. For this reason, in the SDRAM, there is a need for a clock buffer circuit to generate an internal clock signal which is in synchronization with the external clock signal.

The clock buffer circuit for the SDRAM employs a differential amplifier to which a clock signal and an inverted clock signal having an opposite phase to that of the clock signal are inputted in tandem so that a clock duty ratio can be impervious to external noise.

Particularly, in semiconductor memory devices such as DDR/DDR2/DDR3 SDRAMs, data is read/written synchronously with rising and falling edges of a clock, so that it can be transmitted at a higher speed than in the existing SDRAMs.

In order to accurately synchronize data with clock edges, a clock control is required within a memory to generate an internal clock whose duty ratio to the phase of an external clock is 50:50. Also, in order to ensure an accurate output/ clock phase, there is a need for a duty correction circuit (DCC) to correct a duty error of an external clock or internal clock. This DCC becomes more important in high-speed Quad Data Rate (QDR: an operation mode where four data are equally outputted during one cycle) DRAMs.

On the other hand, a conventional clock buffer circuit 100, such as a quadri coupled receiver (QCR) buffer, as shown in FIGS. 1 and 2, must be designed to generate an internal clock signal ICLK having tR (time delay from external clock rising to internal clock rising)/tF (time delay from external clock falling to internal clock falling) characteristics which are always equal in any given conditions. However, in a practical chip, the tR/tF characteristics may not be equal due to various external environmental factors, as shown in FIG. 3.

FIG. 4 illustrates variations in the tR/tF characteristics of the clock buffer circuit of FIG. 2. From this drawing, it can be seen that there is a tR/tF difference of 0.2 ns or more occurring with voltage drops (VDD variations) under the same input conditions. This means a duty distortion due to buffering, which leads to an increase in external parameters to be corrected by the DCC, resulting in a reduction in accuracy of the DCC. As a result, this duty distortion deteriorates the high-speed operation of a memory device.

BRIEF SUMMARY OF THE INVENTION

In an aspect of the present invention, a clock buffer circuit of a semiconductor device comprises: a first clock buffer for receiving and buffering a normal-phase clock signal; a second clock buffer for receiving and buffering a reverse-phase clock signal; and an internal clock generator for generating an internal clock signal in response to output signals from the first and second clock buffers.

The internal clock generator may generate a rising edge of the internal clock signal at a rising edge of the buffered signal from the first clock buffer, and a falling edge of the internal clock signal at a rising edge of the buffered signal from the second clack buffer.

In another aspect of the present invention, a clock buffer circuit of a semiconductor device comprises an internal clock generator for generating a rising edge of an internal clock signal using a first clock signal which is a buffered version of a normal-phase clock signal, and a falling edge of the internal clock signal using a second clock signal which is a buffered version of a reverse-phase clock signal.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other aspects, features and other advantages of the present invention will be more clearly understood from the following detailed description taken in conjunction with the accompanying drawings, in which.

DETAILED DESCRIPTION OF THE INVENTION

Preferred embodiments of the present invention will now be described in detail with reference to the accompanying drawings.

A clock buffer circuit of a semiconductor device according to the present invention is adapted to receive an external clock signal and generate an internal clock signal with no duty distortion, so that external parameters to be corrected by a duty correction circuit (DCC) can be reduced, resulting in an increase in accuracy of the DCC. Therefore, it is possible to improve the high-speed operation and reliability of a memory device.

Figure 5:
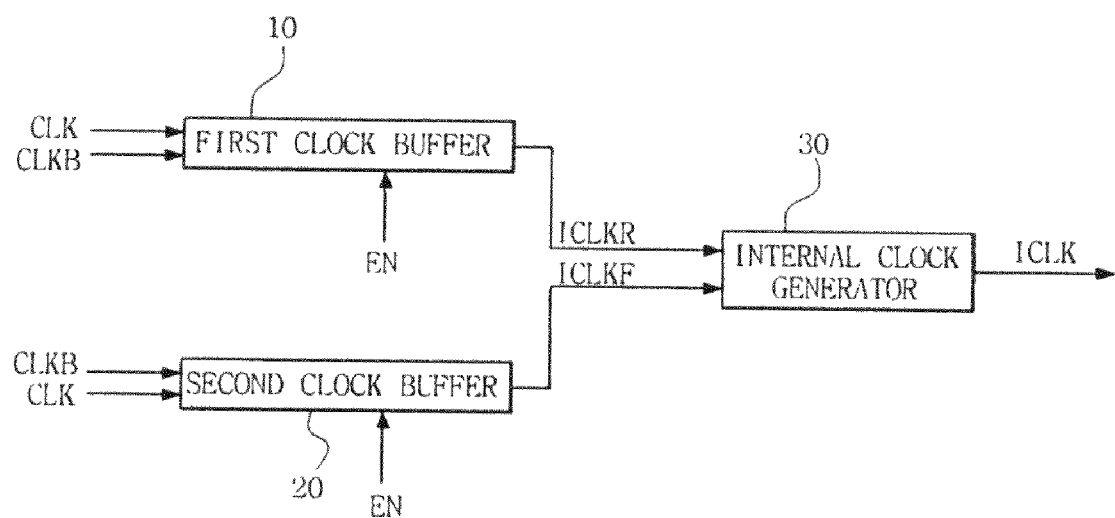
FIG. 5 is a block diagram showing the configuration of a clock buffer circuit according to an exemplary embodiment of the present invention.
Figure 6:
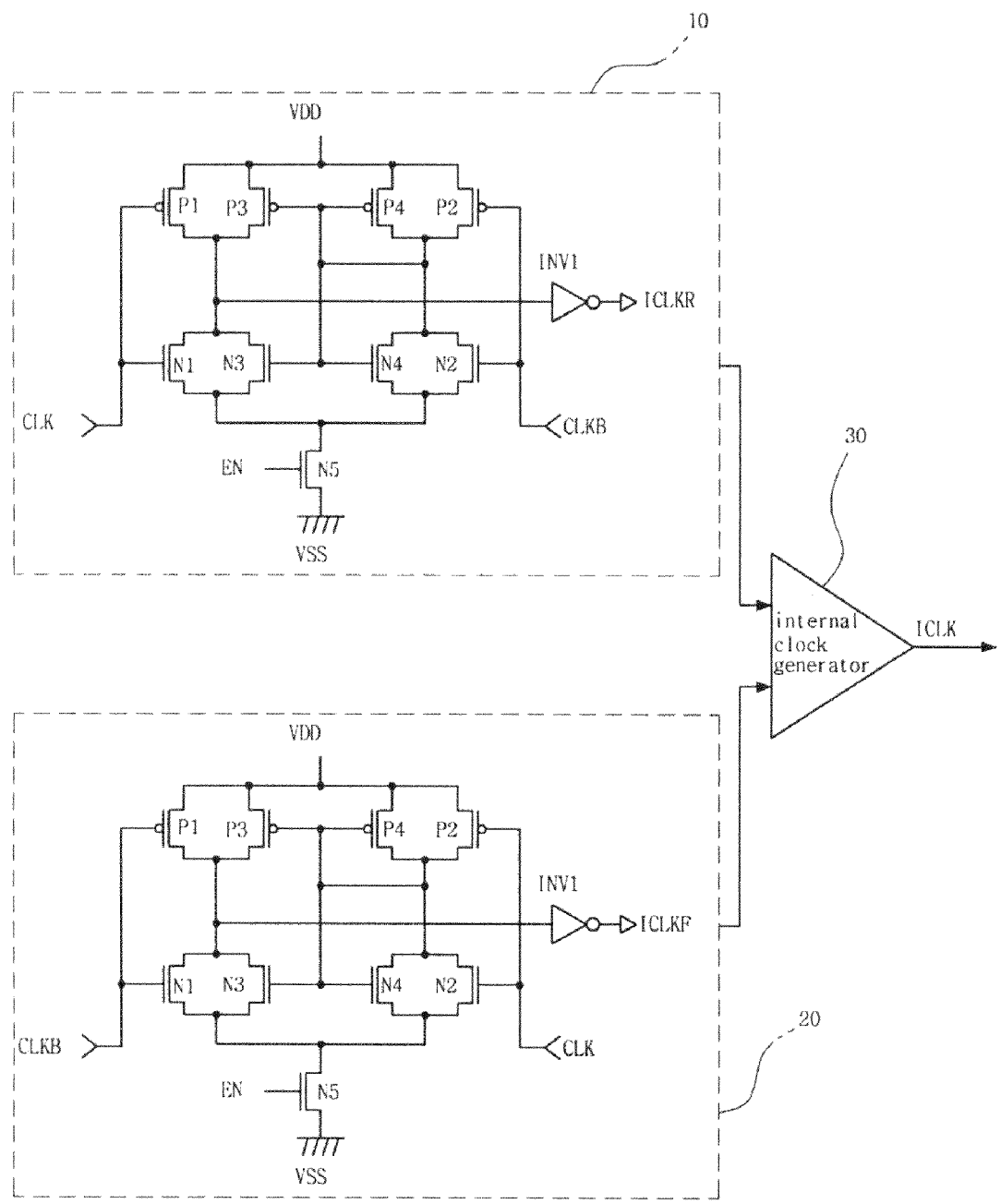
FIG. 6 is a detailed circuit diagram of the clock buffer circuit of FIG. 5.

FIG. 5 is a block diagram showing the configuration of a clock buffer circuit according to an exemplary embodiment of the present invention, and FIG. 6 is a detailed circuit diagram of the clock buffer circuit of FIG. 5.

As shown in FIG. 5, the clock buffer circuit according to this embodiment comprises a first clock buffer 10 for receiving and buffering a normal-phase clock signal CLK, a second clock buffer 20 for receiving and buffering a reverse-phase clock signal CLKB, and an internal clock generator 30 for generating an internal clock signal ICLK in response to output signals ICLKR and ICLKF from the first and second clock buffers 10 and 20.

As shown in FIG. 6, the internal clock generator 30 generates a rising edge of the internal clock signal ICLK at a rising edge of the buffered signal ICLKR from the first clock buffer 10, and a falling edge of the internal clock signal ICLK at a rising edge of the buffered signal ICLKF from the second clock buffer 20.

The internal clock generator 30 includes an edge trigger circuit.

The first clock buffer 10 includes a differential amplifier for receiving the clock signal CLK as an input signal and the clock signal CLKB as a reference signal and amplifying and buffering a difference between the received signals.

The second clock buffer 20 includes a differential amplifier for receiving the clock signal CLKB as an input signal and the clock signal CLK as a reference signal and amplifying and buffering a difference between the received signals.

Figure 7:
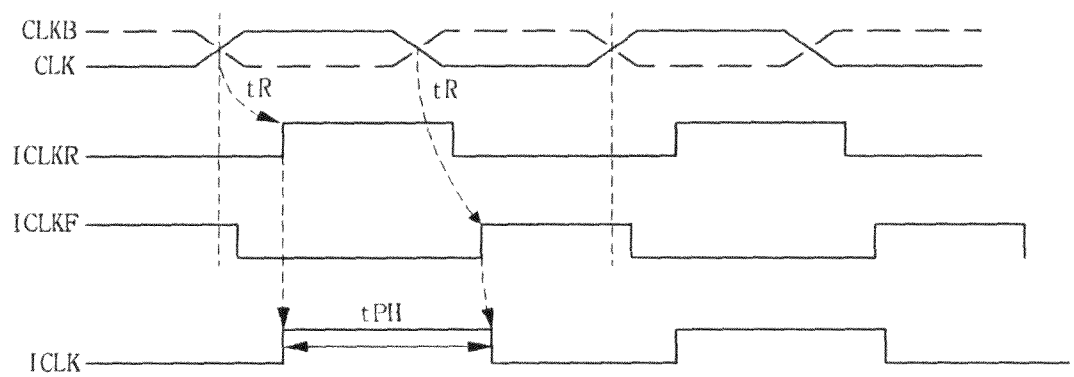
FIG. 7 is a timing diagram illustrating the operation of the clock buffer circuit of FIG. 5.

FIG. 7 is a timing diagram illustrating the operation of the clock buffer circuit of FIG. 5. The clock buffer circuit according to the present embodiment is adapted to generate the rising and falling edges of the internal clock signal ICLK using the rising edges of the clock signals CLK and CLKB. Therefore, it is possible to generate the internal clock signal with no duty distortion of the external clock signal.

In other words, the internal clock signal ICLK is generated by converting the rising edge of the buffered version ICLKR of the clock signal CLK into the rising edge of the internal clock signal and the rising edge of the buffered version ICLKF of the clock signal CLKB into the falling edge of the internal clock signal. At this time, a rising delay time of the buffered version ICLKR of the clock signal CLK, namely, a time delay from external clock rising to internal clock rising (referred to hereinafter as "tR"), is equal to a tR of the buffered version ICLKF of the clock signal CLKB, so that the internal clock signal with no duty distortion of the external clock signal can be generated.

Figure 8:
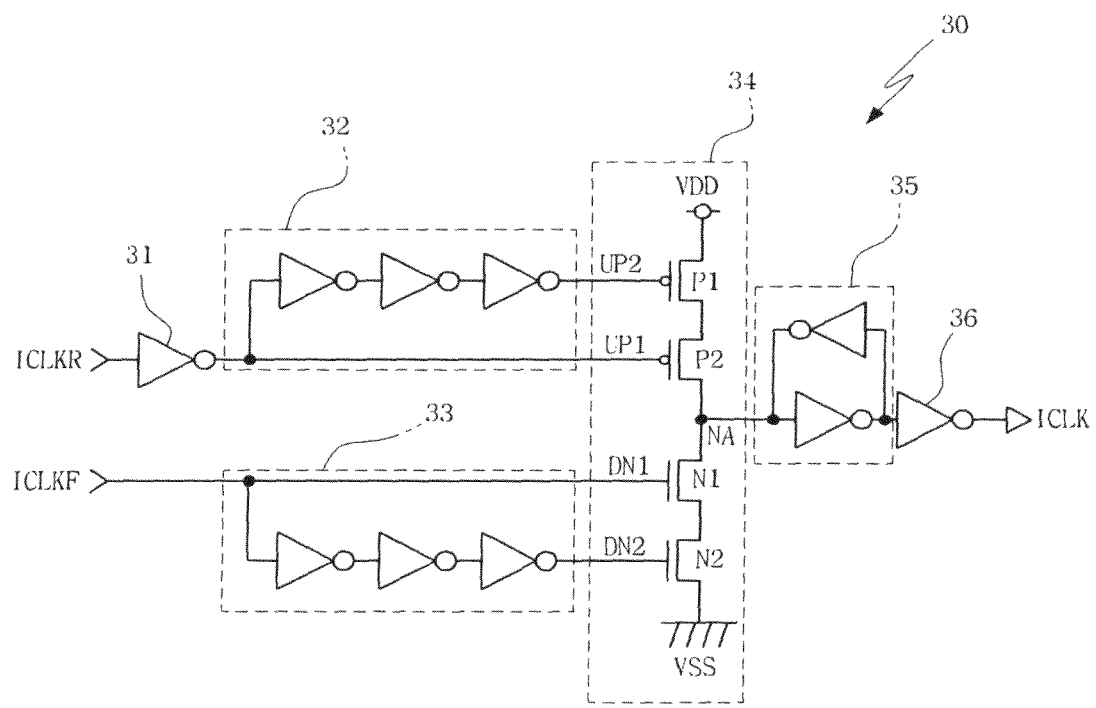
FIG. 8 is a detailed circuit diagram of an embodiment of an internal clock generator in FIG. 5.
Figure 9:
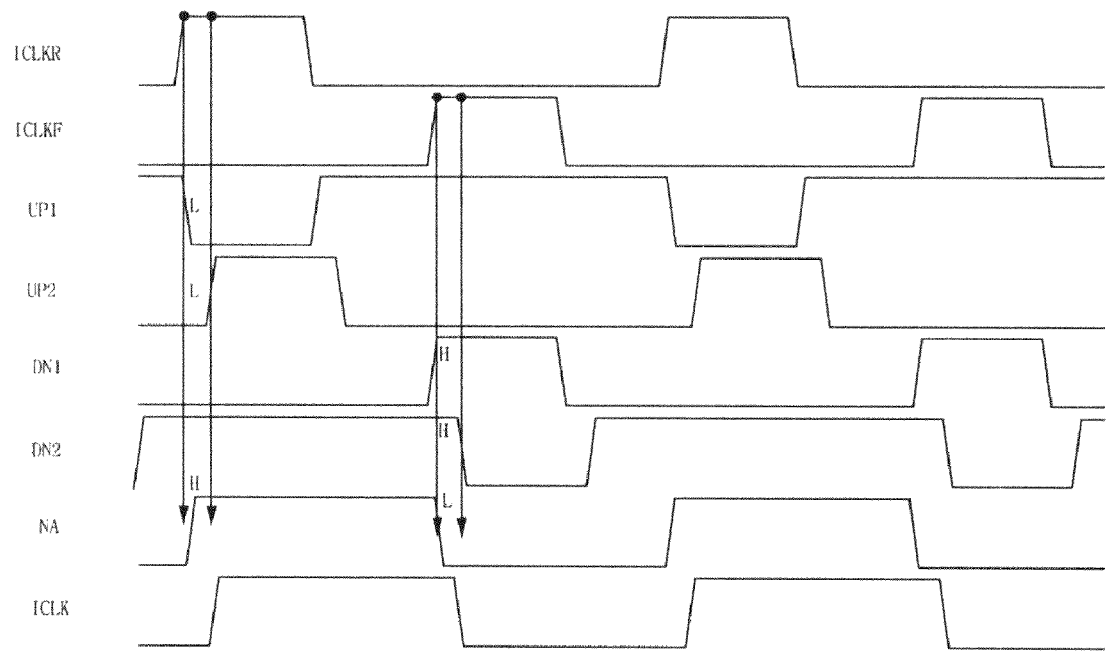
FIG. 9 is a timing diagram illustrating the operation of the internal clock generator of FIG. 8.

FIG. 8 is a detailed circuit diagram of an embodiment of the internal clock generator 30 in FIG. 5, and FIG. 9 is a timing diagram illustrating the operation of the internal clock generator 30 of FIG. 8.

As shown in FIG. 8, the edge trigger circuit includes a first inverter 31 for buffering the output signal ICLKR from the first clock buffer 10, a first delay 32 for delaying an output signal from the first inverter 31, a second delay 33 for delaying the output signal ICLKF from the second clock buffer 20, a driver 34 for performing a pull-up driving operation in response to the output signal from the first inverter 31 and an output signal from the first delay 32 or a pull-down driving operation in response to the output signal ICLKF from the second clock buffer 20 and an output signal from the second delay 33, a latch 35 for latching an output signal from the driver 34, and a second inverter 36 for buffering an output signal from the latch 35.

The driver 34 includes a first pull-up device P1 for performing the pull-up driving operation in response to the output signal from the first delay 32, a second pull-up device P2 connected in parallel to the first pull-up device P1 and acting to perform the pull-up driving operation in response to the output signal from the first inverter 31, a first pull-down device N1 for performing the pull-down driving operation in response to the output signal ICLKF from the second clock buffer 20, and a second pull-down device N2 connected in parallel to the first pull-down device N1 and acting to perform the pull-down driving operation in response to the output signal from the second delay 33.

Each of the first delay 32 and second delay 33 includes an odd number of inverters.

Figure 10:
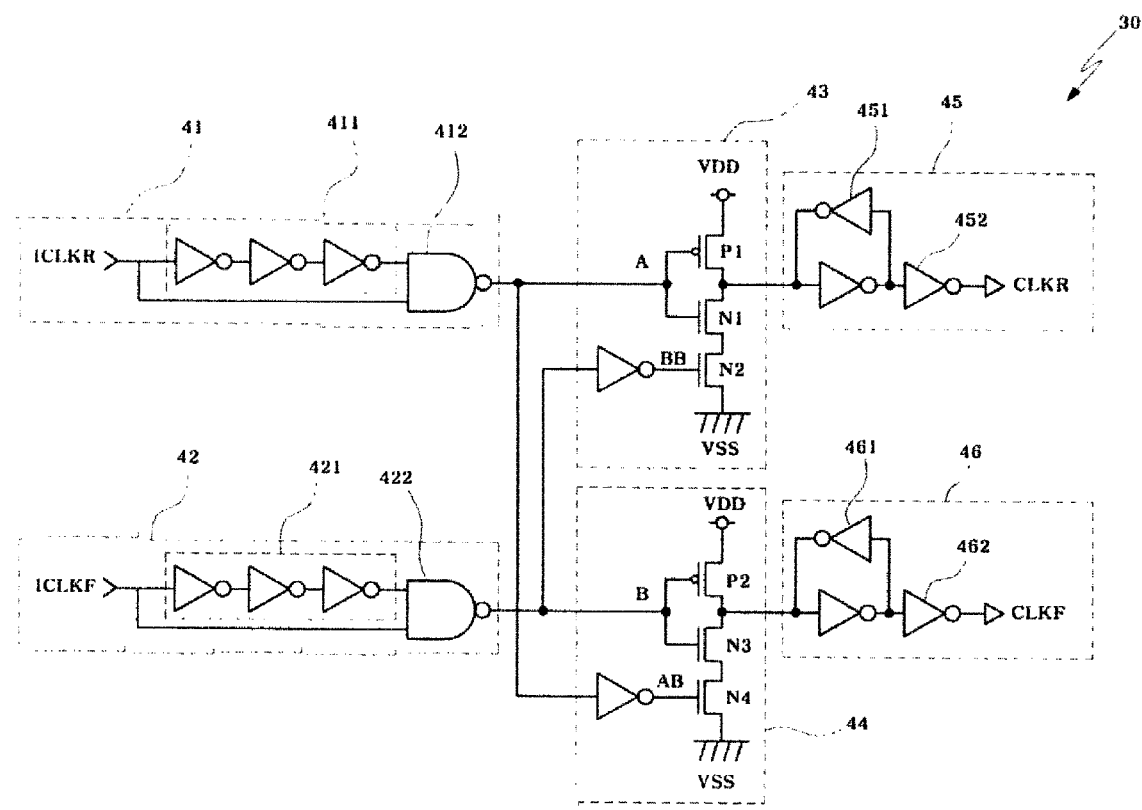
FIG. 10 a detailed circuit diagram of an alternative embodiment of the internal clock generator in FIG. 5.
Figure 11:
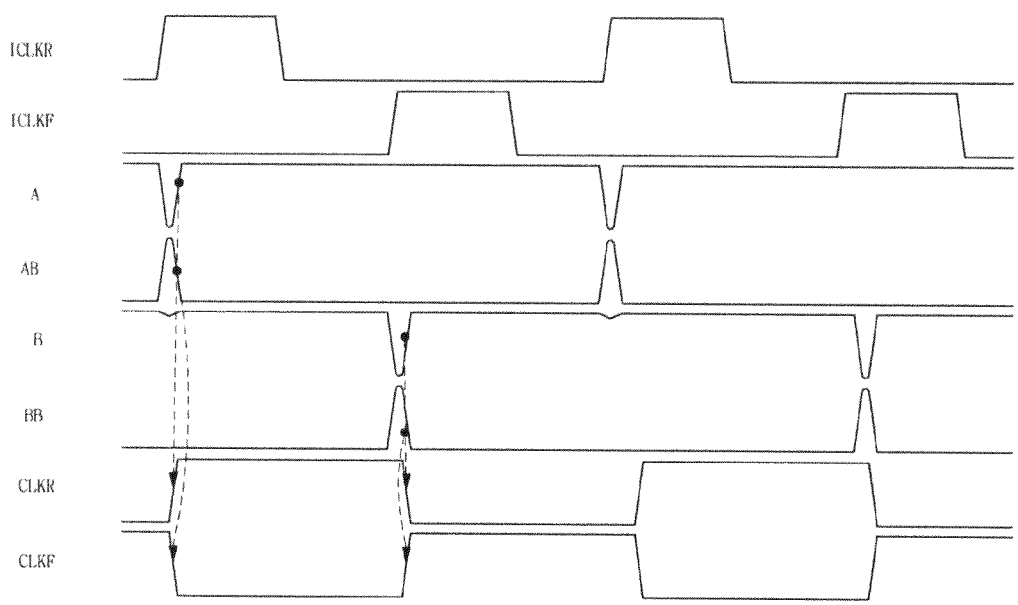
FIG. 11 is a timing diagram illustrating the operation of the internal clock generator of FIG. 10.

FIG. 10 a detailed circuit diagram of an alternative embodiment of the internal clock generator 30 in FIG. 5, and FIG. 11 is a timing diagram illustrating the operation of the internal clock generator 30 of FIG. 10.

As shown in FIG. 10, the edge trigger circuit includes a first logic circuit 41 for performing a logic operation with respect to the output signal ICLKR from the first clock buffer 10, a second logic circuit 42 for performing a logic operation with respect to the output signal ICLKF from the second clock buffer 20, a first driver 43 for performing a pull-up or pull-down driving operation in response to an output signal from the first logic circuit 41 and an inverted version of an output signal from the second logic circuit 42, a second driver 44 for performing the pull-up or pull-down driving operation in response to an inverted version of the output signal from the first logic circuit 41 and the output signal from the second logic circuit 42, a first output unit 45 for outputting an output signal from the first driver 43, and a second output unit 46 for outputting an output signal from the second driver 44.

The first logic circuit 41 includes a first delay 411 for delaying the output signal ICLKR from the first clock buffer 10, and a first logic device 412 for performing a NAND operation with respect to the output signal ICLKR from the first clock buffer 10 and an output signal from the first delay 411.

The second logic circuit 42 includes a second delay 421 for delaying the output signal ICLKF from the second clock buffer 20, and a second logic device 422 for performing the NAND operation with respect to the output signal ICLKF from the second clock buffer 20 and an output signal from the second delay 421.

The first driver 43 includes a first pull-up device P1 for performing the pull-up driving operation in response to the output signal from the first logic circuit 41, a first pull-down device N1 for performing the pull-down driving operation in response to the output signal from the first logic circuit 41, and a second pull-down device N2 connected in parallel to the first pull-down device N1 and acting to perform the pull-down driving operation in response to the inverted version of the output signal from the second logic circuit 42.

The second driver 44 includes a second pull-up device P2 for performing the pull-up driving operation in response to the output signal from the second logic circuit 42, a third pull-down device N3 for performing the pull-down driving operation in response to the output signal from the second logic circuit 42, and a fourth pull-down device N4 connected in parallel to the third pull-down device N3 and acting to perform the pull-down driving operation in response to the inverted version of the output signal from the first logic circuit 41.

The first output unit 45 includes a first latch 451 for latching the output signal from the first driver 43, and a first inverter 452 for buffering an output signal from the first latch 451.

The second output unit 46 includes a second latch 461 for latching the output signal from the second driver 44, and a second inverter 462 for buffering an output signal from the second latch 461.

The operation of the clock buffer circuit with the above-stated configuration according to the exemplary embodiment of the present invention will hereinafter be described with reference to FIGS. 5 to 12.

First, as shown in FIGS. 5 and 6, the first clock buffer 10 receives the clock signal CLK as an input signal and the clock signal CLKB as a reference signal and amplifies and buffers a difference between the received signals. The second clock buffer 20 receives the clock signal CLKB as an input signal and the clock signal CLK as a reference signal and amplifies and buffers a difference between the received signals.

Then, the internal clock generator 30 generates a rising edge of the internal clock signal ICLK at a rising edge of the buffered signal ICLKR from the first clock buffer 10, and a falling edge of the internal clock signal ICLK at a rising edge of the buffered signal ICLKF from the second clock buffer 20. That is, the internal clock generator 30 generates the internal clock signal ICLK by generating the rising and falling edges of the internal clock signal ICLK using the rising edges of the clock signals CLK and CLKB.

FIG. 8 shows the configuration of the exemplary embodiment of the internal clock generator 30 in FIG. 5, and FIG. 9 illustrates the operation of the internal clock generator 30 of FIG. 8.

As shown in FIG. 8, the internal clock generator 30 receives the output signal ICLKR from the first clock buffer 10 and the output signal ICLKF from the second clock buffer 20.

Then, the first inverter 31 buffers the output signal ICLKR from the first clock buffer 10, and the first delay 32 delays the output signal from the first inverter 31. The second delay 33 delays the output signal ICLKF from the second clock buffer 20.

The driver 34 performs the pull-up driving operation in response to the output signal from the first inverter 31 and the output signal from the first delay 32 or the pull-down driving operation in response to the output signal ICLKF from the second clock buffer 20 and the output signal from the second delay 33.

At this time, as shown in FIGS. 8 and 9, the first pull-up device P1 of the driver 34 performs the pull-up driving operation in response to the output signal from the first delay 32. The second pull-up device P2, connected in parallel to the first pull-up device P1, performs the pull-up driving operation in response to the output signal from the first inverter 31.

The first pull-down device N1 of the driver 34 performs the pull-down driving operation in response to the output signal ICLKF from the second clock buffer 20, and the second pull-down device N2 connected in parallel to the first pull-down device N1, performs the pull-down driving operation in response to the output signal from the second delay 33.

That is, as shown in FIG. 9, when the output signal ICLKR from the first clock buffer 10 rises, nodes UP1 and UP2 become low in level in a delay period of the first delay 32, thereby causing the first and second pull-up devices P1 and P2 to be turned on.

Also, when the output signal ICLKF from the second clock buffer 20 rises, nodes DN1 and DN2 become high in level in a delay period of the second delay 33, thereby causing the first and second pull-down devices N1 and N2 to be turned on.

Then, the latch 35 latches the output signal from the driver 34, and the second inverter 36 buffers the output signal from the latch 35.

In this manner, the internal clock signal ICLK is generated by converting the rising edge of the buffered version ICLKR of the clock signal CLK into the rising edge of the internal clock signal and the rising edge of the buffered version ICLKF of the clock signal CLKB into the falling edge of the internal clock signal.

FIG. 10 shows the configuration of the alternative embodiment of the internal clock generator 30 in FIG. 5, and FIG. 11 illustrates the operation of the internal clock generator 30 of FIG. 10.

As shown in FIG. 10, the internal clock generator 30 receives the output signal ICLKR from the first clock buffer 10 and the output signal ICLKF from the second clock buffer 20.

Then, the first logic circuit 41 performs the NAND operation with respect to the output signal ICLKR from the first clock buffer 10 and the output signal from the first delay 411, and the second logic circuit 42 performs the NAND operation with respect to the output signal ICLKF from the second clock buffer 20 and the output signal from the second delay 421.

The first driver 43 performs the pull-up or pull-down driving operation in response to the output signal from the first logic circuit 41 and the inverted version of the output signal from the second logic circuit 42, and the second driver 44 performs the pull-up or pull-down driving operation in response to the inverted version of the output signal from the first logic circuit 41 and the output signal from the second logic circuit 42.

That is, as shown in FIG. 11, at the moment that the output signal ICLKR from the first clock buffer 10 rises, a node A becomes low in level in a delay period of the first delay 411 and a node AB becomes high in level in the same period, thereby causing the first pull-up device P1 and the third and fourth pull-down devices N3 and N4 to be turned on.

Also, at the moment that the output signal ICLKF from the second clock buffer 20 rises, a node B becomes low in level in a delay period of the second delay 421 and a node BB becomes high in level in the same period, thereby causing the first and second pull-down devices N1 and N2 and the second pull-up device P2 to be turned on.

In this manner, the internal clock signal ICLK is generated by converting the rising edge of the buffered version ICLKR of the clock signal CLK into the rising edge of the internal clock signal and the rising edge of the buffered version ICLKF of the clock signal CLKB into the falling edge of the internal clock signal.

Figure 1:
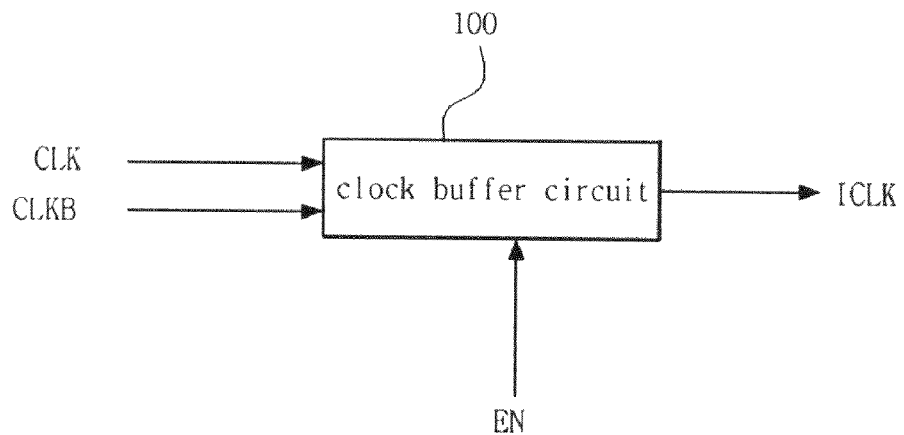
FIG. 1 is a block diagram showing the configuration of a conventional clock buffer circuit.
Figure 2:
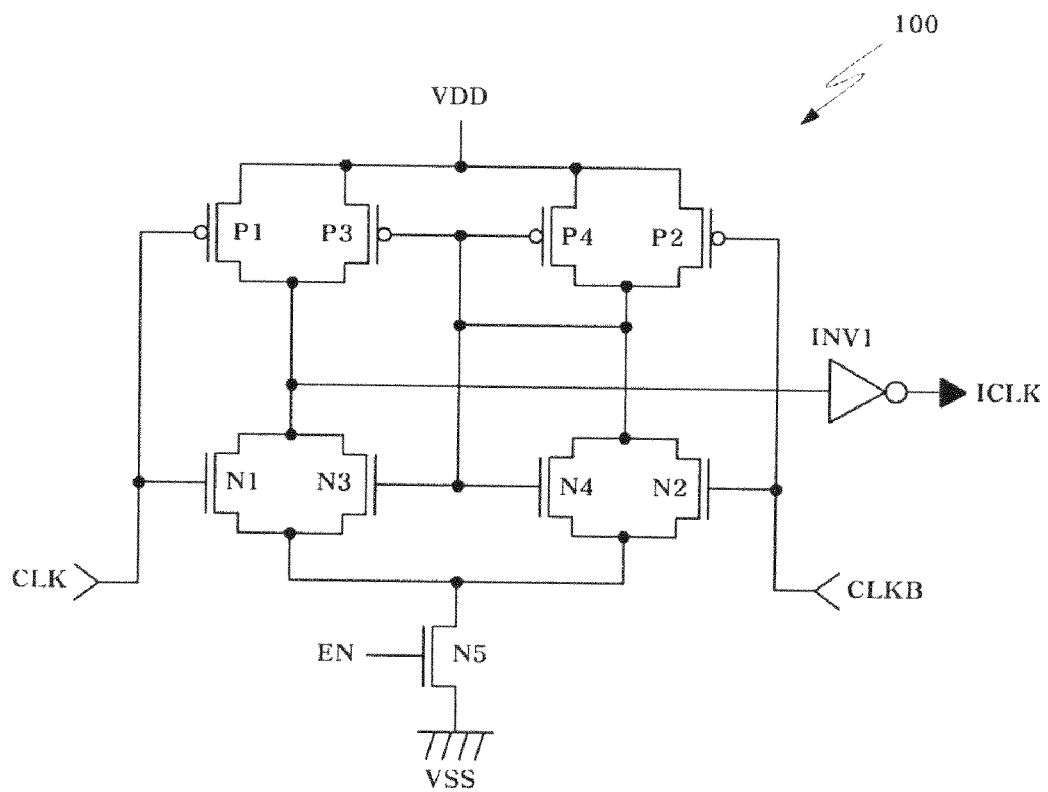
FIG. 2 is a detailed circuit diagram of the clock buffer circuit of FIG. 1.
Figure 3:
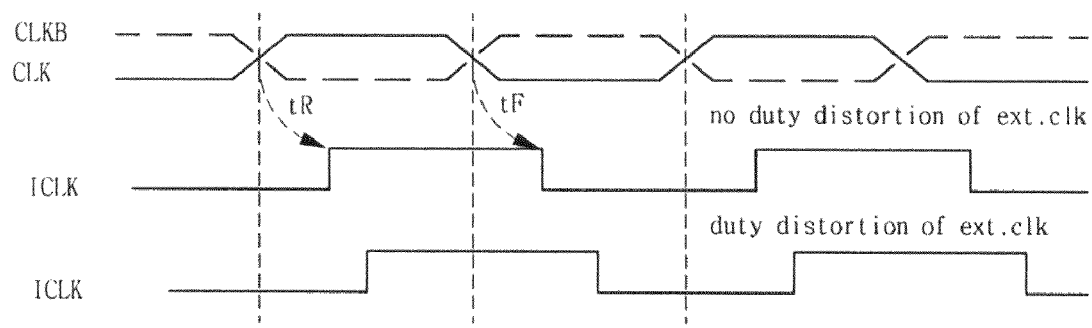
FIG. 3 is a timing diagram illustrating the operation of the clock buffer circuit of FIG. 2.
Figure 4:
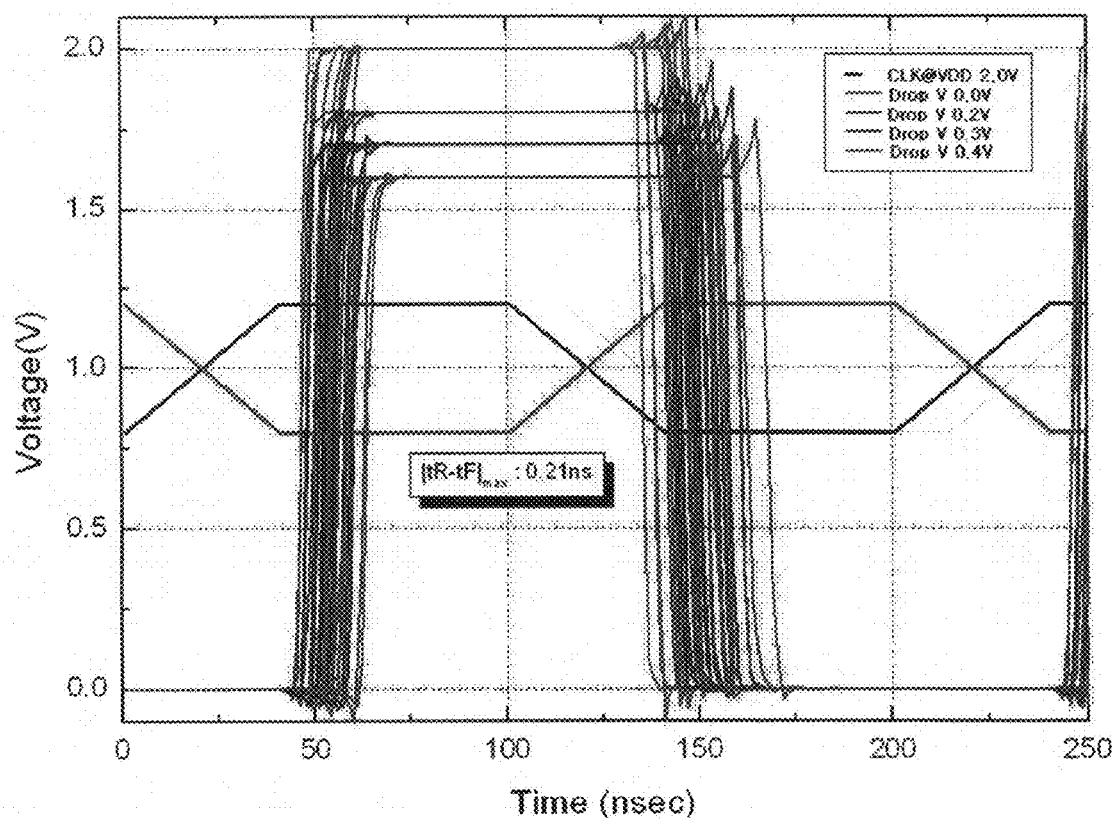
FIG. 4 is a graph illustrating characteristic variations of the clock buffer circuit of FIG. 2.
Figure 12:
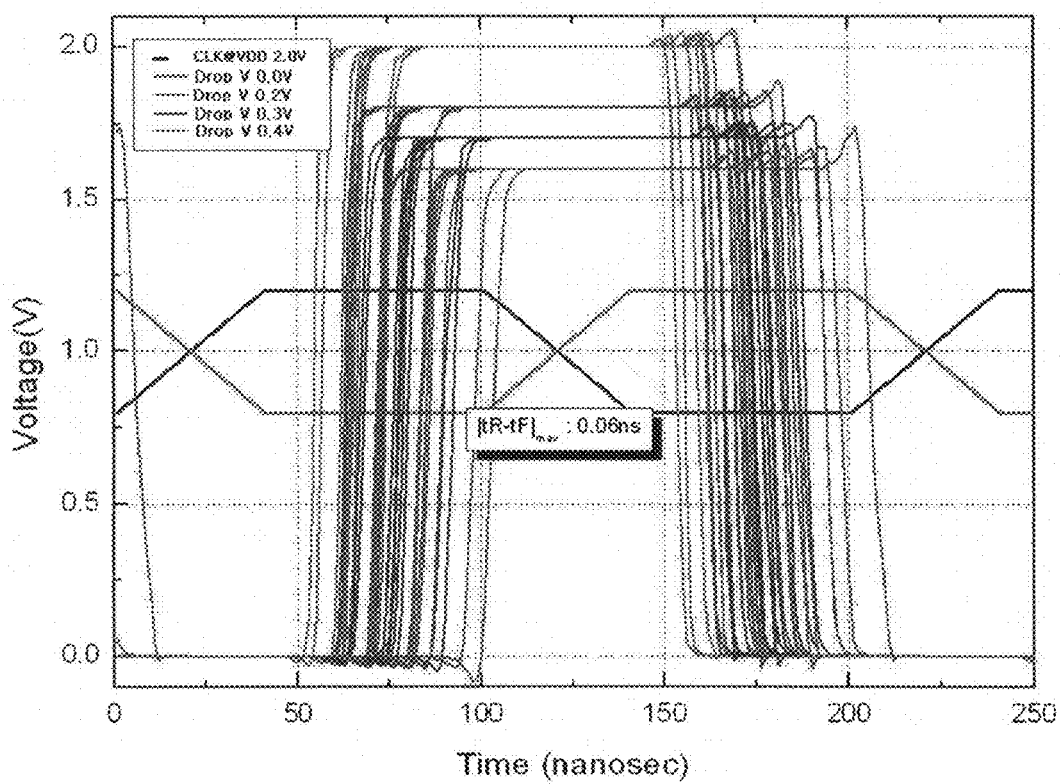
FIG. 12 is a graph illustrating characteristic variations of the clock buffer circuit of FIG. 5.

FIG. 12 is a graph illustrating characteristic variations of the clock buffer circuit of FIG. 5, more particularly variations in tR/tF characteristics with voltage drops (VDD variations) under the same input conditions which are the same as those in FIG. 4. It can be seen from FIG. 12 that the tR/tF difference is reduced by 75% (0.2 ns→0.05 ns) of that in FIG. 4.

As apparent from the above description, the clock buffer circuit according to the present invention can generate the rising and falling edges of the internal clock signal ICLK using the rising edges of the clock signals CLK and CLKB. Therefore, it is possible to generate the internal clock signal with no duty distortion of the external clock signal. In other words, the internal clock signal ICLK is generated by converting the rising edge of the buffered version ICLKR of the clock signal CLK into the rising edge of the internal clock signal and the rising edge of the buffered version ICLKF of the clock signal CLKB into the falling edge of the internal clock signal.

At this time, the tR of the buffered version ICLKR of the clock signal CLK is equal to the tR of the buffered version ICLKF of the clock signal CLKB, so that the internal clock signal with no duty distortion of the external clock signal can be generated.

The generation of this internal clock signal leads to a reduction in external parameters to be corrected by a duty correction circuit (DCC), resulting in an increase in accuracy of the DCC. Therefore, it is possible to improve the high-speed operation of a memory device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A clock buffer circuit of a semiconductor device comprising:
    a first clock buffer configured to receive and buffer a normal-phase clock signal;
    a second clock buffer configured to receive and buffer a reverse-phase clock signal;
    a first logic circuit for performing a logic operation with respect to an output signal from the first clock buffer;
    a second logic circuit for performing a logic operation with respect to an output signal from the second clock buffer;
    a first driver for performing a pull-up or pull-down driving operation in response to an output signal from the first logic circuit and an inverted version of an output signal from the second logic circuit;
    a second driver for performing the pull-up or pull-down driving operation in response to an inverted version of the output signal from the first logic circuit and the output signal from the second logic circuit;
    a first output unit for outputting an output signal from the first driver; and
    a second output unit for outputting an output signal from the second driver.

2. The clock buffer circuit according to claim 1, wherein the first logic circuit comprises:
    a first delay for delaying the output signal from the first clock buffer; and
    a first logic device for performing a NAND operation with respect to the output signal from the first clock buffer and an output signal from the first delay.

3. The clock buffer circuit according to claim 2, wherein the second logic circuit comprises:
    a second delay for delaying the output signal from the second clock buffer; and
    a second logic device for performing the NAND operation with respect to the output signal from the second clock buffer and an output signal from the second delay.

4. The clock buffer circuit according to claim 1, wherein the first driver comprises:
    a first pull-up device for performing the pull-up driving operation in response to the output signal from the first logic circuit;
    a first pull-down device for performing the pull-down driving operation in response to the output signal from the first logic circuit; and
    a second pull-down device connected in parallel to the first pull-down device, the second pull-down device performing the pull-down driving operation in response to the inverted version of the output signal from the second logic circuit.

5. The clock buffer circuit according to claim 4, wherein the second driver comprises:
    a second pull-up device for performing the pull-up driving operation in response to the output signal from the second logic circuit;
    a third pull-down device for performing the pull-down driving operation in response to the output signal from the second logic circuit; and
    a fourth pull-down device connected in parallel to the third pull-down device, the fourth pull-down device performing the pull-down driving operation in response to the inverted version of the output signal from the first logic circuit.

6. The clock buffer circuit according to claim 1, wherein the first output unit comprises:
    a first latch for latching the output signal from the first driver; and
    a first inverter for buffering an output signal from the first latch.

7. The clock buffer circuit according to claim 6, wherein the second output unit comprises:
    a second latch for latching the output signal from the second driver; and
    a second inverter for buffering an output signal from the second latch.

* * * * *